United States Patent
Xu

(10) Patent No.: US 10,049,636 B2
(45) Date of Patent: Aug. 14, 2018

(54) GATE DRIVE CIRCUIT AND LIQUID CRYSTAL DISPLAY DEVICE

(71) Applicant: SHENZHEN CHINA STAR OPTOELECTRONICS TECHNOLOGY CO., LTD., Guangdong (CN)

(72) Inventor: Xiangyang Xu, Guangdong (CN)

(73) Assignee: SHENZHEN CHINA STAR OPTOELECTRONICS TECHNOLOGY CO. LTD., Guangdong (CN)

(*) Notice: Subject to any disclaimer, the term of this patent is extended or adjusted under 35 U.S.C. 154(b) by 49 days.

(21) Appl. No.: 15/302,170

(22) PCT Filed: Jun. 30, 2016

(86) PCT No.: PCT/CN2016/087802
§ 371 (c)(1),
(2) Date: Oct. 6, 2016

(87) PCT Pub. No.: WO2017/215040
PCT Pub. Date: Dec. 21, 2017

(65) Prior Publication Data
US 2018/0061349 A1    Mar. 1, 2018

(30) Foreign Application Priority Data

Jun. 13, 2016  (CN) .......................... 2016 1 0415545

(51) Int. Cl.
*G09G 3/36*        (2006.01)

(52) U.S. Cl.
CPC ...... *G09G 3/3677* (2013.01); *G09G 2310/0289* (2013.01); *G09G 2310/08* (2013.01); *G09G 2320/043* (2013.01); *G09G 2330/021* (2013.01)

(58) Field of Classification Search
CPC ......... G09G 3/3677; G09G 2310/0286; G09G 2320/0219; G09G 2310/0267; G09G 2310/067; G09G 3/3266; G09G 2300/0408; G02F 1/13306; G11C 19/28
See application file for complete search history.

(56) References Cited

U.S. PATENT DOCUMENTS

| 2014/0103983 A1* | 4/2014 | Chang | G09G 3/3655 327/198 |
| 2015/0102990 A1* | 4/2015 | Kuo | G09G 3/3677 345/99 |
| 2015/0310819 A1* | 10/2015 | Xiao | G11C 19/28 345/212 |

* cited by examiner

Primary Examiner — Hong Zhou
(74) Attorney, Agent, or Firm — Mark M. Friedman

(57) ABSTRACT

The present invention provides a gate drive circuit and a liquid crystal display device. The gate drive circuit includes multiple stages of gate drive units connected in series. An N-th stage gate drive unit includes a pull-up control module, a pull-up module, a first pull-down module, a pull-down control module, and a second pull-down module. The second pull-down module includes a first thin film transistor and a second thin film transistor.

20 Claims, 3 Drawing Sheets

GATE DRIVE CIRCUIT AND LIQUID CRYSTAL DISPLAY DEVICE

BACKGROUND OF THE INVENTION

Field of Invention

The present invention relates to a display field, and more particularly to a gate drive circuit and a liquid crystal display device.

Description of Prior Art

A gate drive circuit is referred to as a GOA (Gate Driver on Array) circuit which utilizes a conventional array manufacturing process of a thin film transistor liquid crystal display device to manufacture a gate scan drive signal circuit on an array substrate, thereby implementing a drive method in which gates are scanned row by row.

A structure of a conventional N-th stage GOA unit shown in FIG. 1 mainly comprises a pull-up control module 101, a pull-up module 102, a pull-down module 103, and a pull-down control module 104. G(n−1) is a signal which is inputted to a first (N−1)th stage signal input terminal. ST(n−1) is a signal which is inputted to a second (N−1)th stage signal input terminal. G(n+1) is a signal which is inputted to an (N+1)th stage signal input terminal. G(n) is an output signal of a first output terminal. ST(n+1) is an output signal of a second output terminal. Q(n) is a signal of a pull-down point. CLKA and CLKB are signals which are inputted to a high frequency clock signal input terminal. In a practical application, a coupling capacitance exists between a source and a gate of a thin film transistor in the pull-up module 102, a voltage fluctuation occurs when a voltage of the pull-down point or a voltage of the first output terminal is pulled down. As a result, the reliability and the lifespan of the gate drive circuit are decreased.

Consequently, there is a need to provide a gate drive circuit and a liquid crystal display device to solve the problem which exists in the prior art.

SUMMARY OF THE INVENTION

An objective of the present invention is to provide a gate drive circuit and a liquid crystal display device to solve the technical problem that the pull-down point is easily fluctuated when the pull-down point is pulled down in the prior art.

To solve the above-mentioned technical problem, the present invention provides a gate drive circuit which comprises multiple stages of gate drive units connected in series. An N-th stage gate drive unit comprises:

A first (N−1)th stage signal input terminal, a second (N−1)th stage signal input terminal, an (N+1)th stage signal input terminal, a high frequency clock signal input terminal, a first output terminal, a second output terminal, a pull-down point, a first low frequency clock signal input terminal, and a low level input terminal, wherein N is an integer greater than 3;

Wherein the first (N−1)th stage signal input terminal is connected to a first output terminal of an (N−1)th stage gate drive unit; the second (N−1)th stage signal input terminal is connected to a second output terminal of the (N−1)th stage gate drive unit; the first output terminal is connected to a first (N−1)th stage signal input terminal of an (N+1)th stage gate drive unit; the second output terminal is connected to a second (N−1)th stage signal input terminal of the (N+1)th stage gate drive unit; the first output terminal is utilized for providing a scan signal for an N-th stage scan line in a display area;

The N-th stage gate drive unit further comprises:

A pull-up control module connected to the first (N−1)th stage signal input terminal, the second (N−1)th stage signal input terminal, and the pull-down point and utilized for pulling up a voltage of the pull-down point;

A pull-up module connected to the high frequency clock signal input terminal, the first output terminal, and the second output terminal, connected to the pull-down point together with the pull-up control module, and utilized for charging signals of the first output terminal and the second output terminal to pull up the voltage of the pull-down point;

A first pull-down module connected to the (N+1)th stage signal input terminal, connected to the first output terminal together with the pull-up module, connected to the pull-down point together with the pull-up control module, and utilized for pulling down the voltages of the pull-down point and the first output terminal when the signal of the first output terminal is in an uncharged state;

A pull-down control module connected to the pull-up control module and the pull-up module and utilized for pulling down the voltages of the pull-down point and the first output terminal when the voltage of the pull-down point is at a low voltage; and A second pull-down module comprising a first thin film transistor and a second thin film transistor, connected to the first low frequency clock signal input terminal and the pull-down control module, connected to the pull-down point together with the pull-up control module and the pull-up module, and utilized for controlling the voltages of the pull-down point and the first output terminal to be equal to a predetermined voltage after the pull-down point and the first output terminal are pulled down;

The first thin film transistor having a first gate, a first source, and a first drain; the second thin film transistor having a second gate, a second source, and a second drain; the first gate and the second gate connected to the first low frequency clock signal input terminal; the first source connected to the pull-down point; the first drain connected to the low level input terminal; the second source connected to the first output terminal; the second drain connected to the low level input terminal.

To solve the above-mentioned technical problem, the present invention provides a gate drive circuit which comprises multiple stages of gate drive units connected in series. An N-th stage gate drive unit comprises:

A first (N−1)th stage signal input terminal, a second (N−1)th stage signal input terminal, an (N+1)th stage signal input terminal, a high frequency clock signal input terminal, a first output terminal, a second output terminal, a pull-down point, a first low frequency clock signal input terminal, and a low level input terminal, wherein N is an integer greater than 3;

Wherein the first (N−1)th stage signal input terminal is connected to a first output terminal of an (N−1)th stage gate drive unit; the second (N−1)th stage signal input terminal is connected to a second output terminal of the (N−1)th stage gate drive unit; the first output terminal is connected to a first (N−1)th stage signal input terminal of an (N+1)th stage gate drive unit; the second output terminal is connected to a second (N−1)th stage signal input terminal of the (N+1)th stage gate drive unit; the first output terminal is utilized for providing a scan signal for an N-th stage scan line in a display area;

The N-th stage gate drive unit further comprises:

A pull-up control module connected to the first (N−1)th stage signal input terminal, the second (N−1)th stage signal input terminal, and the pull-down point and utilized for pulling up a voltage of the pull-down point;

A pull-up module connected to the high frequency clock signal input terminal, the first output terminal, and the second output terminal, connected to the pull-down point together with the pull-up control module, and utilized for charging signals of the first output terminal and the second output terminal to pull up the voltage of the pull-down point;

A first pull-down module connected to the (N+1)th stage signal input terminal, connected to the first output terminal together with the pull-up module, connected to the pull-down point together with the pull-up control module, and utilized for pulling down the voltages of the pull-down point and the first output terminal when the signal of the first output terminal is in an uncharged state;

A pull-down control module connected to the pull-up control module and the pull-up module and utilized for pulling down the voltages of the pull-down point and the first output terminal when the voltage of the pull-down point is at a low voltage; and A second pull-down module comprising a first thin film transistor and a second thin film transistor, connected to the first low frequency clock signal input terminal and the pull-down control module, connected to the pull-down point together with the pull-up control module and the pull-up module, and utilized for controlling voltages of the pull-down point and the first output terminal to be equal to a predetermined voltage after the pull-down point and the first output terminal are pulled down.

Another objective of the present invention is to provide a liquid crystal display device which comprises the above-mentioned gate drive circuit and a display area connected to the gate drive circuit.

The gate drive circuit and the liquid crystal display device of the present invention pull down the voltage by adding the pull-down module when the voltages of the pull-down point and the output terminals are fluctuated. Accordingly, the effect of the coupling capacitance on the gate drive circuit can be eliminated, and the reliability and the lifespan of the gate drive circuit are improved.

For a better understanding of the aforementioned content of the present invention, preferable embodiments are illustrated in accordance with the attached figures for further explanation.

DETAILED DESCRIPTION OF THE PREFERRED EMBODIMENTS

Figure 1:
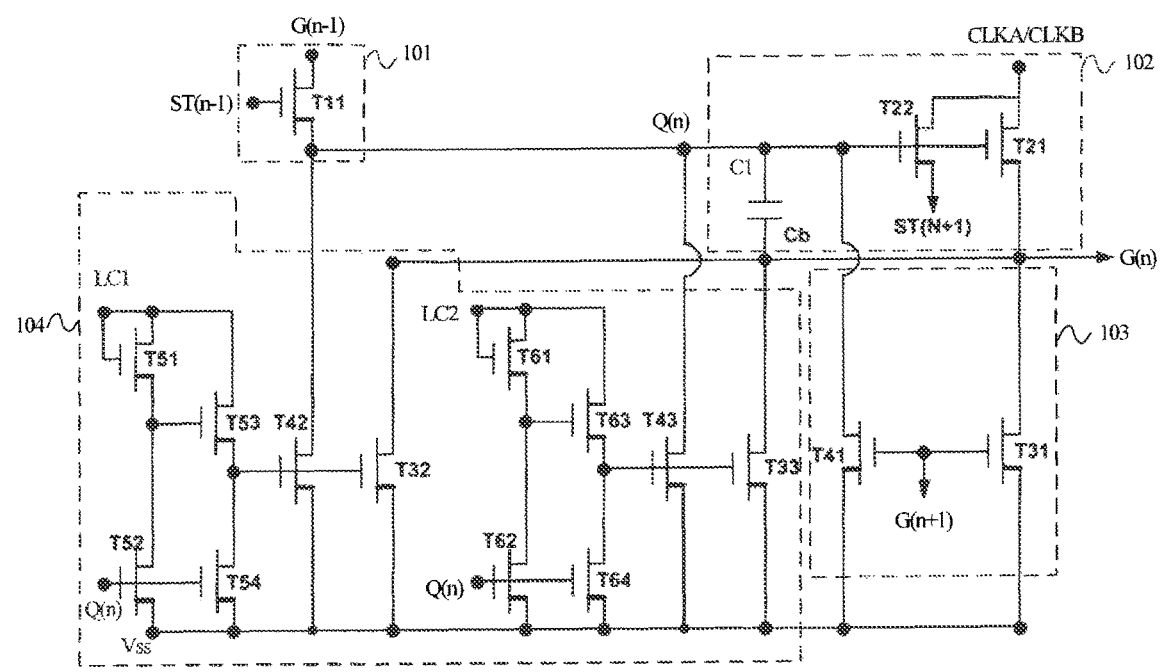
FIG. 1 is a structure of an N-th stage gate drive circuit in the prior art.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

In the drawings, structure-like elements are labeled with like reference numerals.

Figure 2:
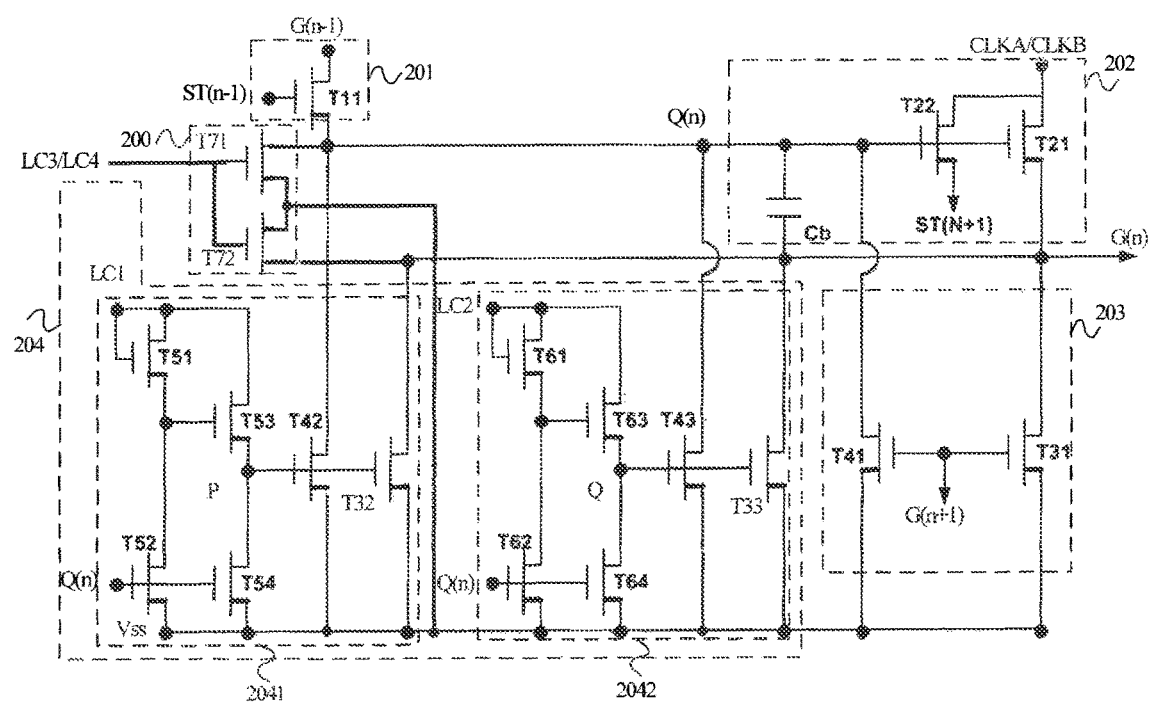
FIG. 2 is a structure of an N-th stage gate drive circuit in accordance with the present invention.

Please refer to FIG. 2. FIG. 2 is a structure of an N-th stage gate drive circuit in accordance with the present invention.

The gate drive circuit in accordance with the present invention comprises multiple stages of gate drive units connected in series. The N-th stage gate drive unit shown in FIG. 2 comprises a first (N−1)th stage signal input terminal, a second (N−1)th stage signal input terminal, an (N+1)th stage signal input terminal, a high frequency clock signal input terminal, a first output terminal, a second output terminal, a pull-down point, a first low frequency clock signal input terminal, and a low level input terminal. N is an integer greater than 3.

G(N−1) is a signal which is inputted to the first (N−1)th stage signal input terminal. ST(N−1) is a signal which is inputted to the second (N−1)th stage signal input terminal. CLKA and CLKB are signals which are inputted to the high frequency clock signal input terminal. G(n) is a signal of the first output terminal. ST(n+1) is a signal of the second output terminal. Q(n) is a signal of the pull-down point. VSS is the low level input terminal. LC3/LC4 are signals of the first low frequency clock signal input terminal.

The first (N−1)th stage signal input terminal is connected to a first output terminal of an (N−1)th stage gate drive unit. The second (N−1)th stage signal input terminal is connected to a second output terminal of the (N−1)th stage gate drive unit. The first output terminal is connected to a first (N−1)th stage signal input terminal of an (N+1)th stage gate drive unit. The second output terminal is connected to a second (N−1)th stage signal input terminal of the (N+1)th stage gate drive unit. The first output terminal is utilized for providing a scan signal for an N-th stage scan line in a display area.

The N-th stage gate drive circuit further comprises a pull-up control module 201, a pull-up module 202, a first pull-down module 203, a pull-down control module 204, and a second pull-down module 200.

The pull-up control module 201 is connected to the first (N−1)th stage signal input terminal, the second (N−1)th stage signal input terminal, and the pull-down point and utilized for pulling up a voltage of the pull-down point to control whether to turn on or turn off the pull-up module 202.

The pull-up module 202 is connected to the high frequency clock signal input terminal, the first output terminal, and the second output terminal, is connected to the pull-down point together with the pull-up control module 201, and is utilized for charging signals of the first output terminal and the second output terminal to pull up a voltage of the signal Q(n) of the pull-down point.

The first pull-down module 203 is connected to the (N+1)th stage signal input terminal, is connected to the first output terminal together with the pull-up module 202, is connected to the pull-down point together with the pull-up control module 201, and is utilized for pulling down the voltages of the pull-down point and the first output terminal when the signal of the first output terminal is in an uncharged state.

The pull-down control module 204 is connected to the pull-up control module 201 and the pull-up module 202 and utilized for pulling down the voltages of the pull-down point and the first output terminal when the voltage of the pull-down point is at a low voltage.

The second pull-down module 200 comprises a first thin film transistor T71 and a second thin film transistor T72, is connected to the first low frequency clock signal input terminal and the pull-down control module 204, is connected to the pull-down point together with the pull-up control module 201 and the pull-up module 202, and is utilized for controlling voltages of the pull-down point and the first output terminal to be equal to a predetermined voltage after the pull-down point and the first output terminal are pulled down, so as to cancel fluctuations of the voltages of the pull-down point and the first output terminal in a pull-down process.

The first thin film transistor T71 has a first gate, a first source, and a first drain. The second thin film transistor T72 has a second gate, a second source, and a second drain. The first gate and the second gate are connected to the first low frequency clock signal input terminal. The first source is connected to the pull-down point. The first drain is connected to the low level input terminal. The second source is connected to the first output terminal. The second drain is connected to the low level input terminal.

The pull-down control module 201 comprises a third thin film transistor T11. The third thin film transistor T11 has a third gate, a third source, and a third drain.

The third source is connected to the first (N−1)th stage signal input terminal. The third gate is connected to the second (N−1)th stage signal input terminal. The third drain is connected to the pull-down point.

The pull-up module 202 comprises a fourth thin film transistor T22 and a fifth thin film transistor T21. The fourth thin film transistor 122 has a fourth gate, a fourth source, and a fourth drain. The fifth thin film transistor T21 has a fifth gate, a fifth source, and a fifth drain.

The fourth gate and the fifth gate are together connected to the pull-down point. The fourth source and the fifth source are together connected to the high frequency clock signal input terminal. The fourth drain is connected to the second output terminal. The fifth drain is connected to the first output terminal.

The pull-up module 202 further comprises a capacitance cb. A terminal of the capacitance cb is connected to the pull-down point. The other terminal of the capacitance cb is connected to the first output terminal.

The first pull-down module 203 comprises a sixth thin film transistor 141 and a seventh thin film transistor T31. The sixth thin film transistor T41 has a sixth gate, a sixth source, and a sixth drain. The seventh thin film transistor T41 has a seventh gate, a seventh source, and a seventh drain.

The sixth gate and the seventh gate are connected to the (N+1)th stage signal input terminal. The sixth source is connected to the pull-down point. The sixth drain is connected to the low level input terminal. The seventh source is connected to the first output terminal. The seventh drain is connected to the low level input terminal.

The N-th stage gate drive unit further comprises a second low frequency clock signal input terminal and a third low frequency clock signal input terminal. LC1 is a signal of the second low frequency clock signal input terminal. LC2 is a signal of the third low frequency clock signal input terminal.

The pull-down control module 204 comprises a first pull-down control submodule 2041.

The first pull-down control submodule 2041 comprises an eighth thin film transistor T52, a ninth thin film transistor T51, a tenth thin film transistor T53, an eleventh thin film transistor T54, a twelfth thin film transistor T42, and a thirteenth thin film transistor T32.

The eighth thin film transistor T52 has an eighth gate, an eighth source, and an eighth drain. The ninth thin film transistor T51 has a ninth gate, a ninth source, and a ninth drain. The tenth thin film transistor T53 has a tenth gate, a tenth source, and a tenth drain. The eleventh thin film transistor T54 has an eleventh gate, an eleventh source, and an eleventh drain. The twelfth thin film transistor T42 has a twelfth gate, a twelfth source, and a twelfth drain. The thirteenth thin film transistor T32 has a thirteenth gate, a thirteenth source, and a thirteenth drain.

The eighth gate is connected to the pull-down point. The eighth source is connected to the ninth drain. The eighth drain is connected to the low level input terminal.

The ninth gate is connected to the second low frequency clock signal input terminal. The ninth source is connected to the ninth gate. The ninth drain is connected to the tenth gate.

The tenth source is connected to the ninth source. The tenth drain is connected to the twelfth gate and the thirteen gate.

The eleventh gate is connected to the eighth gate. The eleventh source is connected to the tenth drain. The eleventh drain is connected to the low level input terminal.

The twelfth source is connected to the pull-down point. The thirteenth source is connected to the first output terminal. The twelfth drain and the thirteenth drain are connected to the low level input terminal.

The pull-down control module 204 comprises a second pull-down control submodule 2042.

The second pull-down control submodule 2042 comprises a fourteenth thin film transistor T62, a fifteenth thin film transistor T61, a sixteenth thin film transistor T63, a seventeenth thin film transistor T64, an eighteenth thin film transistor T43, and a nineteenth thin film transistor T33.

The fourteenth thin film transistor T62 has a fourteenth gate, a fourteenth source, and a fourteenth drain. The fifteenth thin film transistor T61 has a fifteenth gate, a fifteenth source, and a fifteenth drain. The sixteenth thin film transistor T63 has a sixteenth gate, a sixteenth source, and a sixteenth drain. The seventeenth thin film transistor T64 has a seventeenth gate, a seventeenth source, and a seventeenth drain. The eighteenth thin film transistor T43 has an eighteenth gate, an eighteenth source, and an eighteenth drain. The nineteenth thin film transistor T33 has a nineteenth gate, a nineteenth source, and a nineteenth drain.

The fourteenth gate is connected to the pull-down point. The fourteenth source is connected to the fifth drain. The fourteenth drain is connected to the low level input terminal.

The fifteenth gate is connected to the third low frequency clock signal input terminal. The fifteenth source is connected to the fifteenth gate. The fifteenth drain is connected to the sixteenth gate.

The sixteenth source is connected to the fifteenth source. The sixteenth drain is connected to the eighteenth gate and the nineteenth gate.

The seventeenth gate is connected to the fourteenth gate. The seventeenth source is connected to the sixteenth drain. The seventeenth drain is connected to the low level input terminal.

The eighteenth source is connected to the pull-down point. The nineteenth source is connected to the first output terminal. The eighteenth drain and the nineteenth drain are connected to the low level input terminal.

An operational principle of the gate drive unit of the present invention is described as follows. When the signal ST(N−1) of the second (N−1)th stage signal input terminal is at a high level, the third thin film transistor T11 is turned on. When the signal G(n−1) of the first (N−1)th stage signal input terminal is at a high level, the signal Q(N) of the pull-down point is changed to the high level. Meanwhile, the fourth thin film transistor T22 and the fifth thin film transistor T21 are turned on, and the signal CLKA or CLKB of the high frequency clock signal input terminal is inputted to turn on the thin film transistor T21. Accordingly, the signal G(n) of the first output terminal is at the high level. Meanwhile, the first pull-down module 203 and the pull-down control module 204 stops working. In a next half clock cycle, Q(n) remains at the high level. The signal CLKA/ CLKB is outputted to the first output terminal via T21, so that G(n) is at the high level. When the point Q(n) is at the high level, a point P or Q is at a low level. The voltages of Q(n) and G(n) are not pulled down.

In a next half clock cycle, G(n+1) outputs a high level to turn on the thin film transistors T31 and T41 of the first pull-down module 203, thereby pulling down the voltages of Q(n) and G(n). When the point Q(n) is at the low level, the point P or Q is at the high level. Accordingly, T42\T32 or T43\T33 are turned on, and the voltages of Q(n) and G(n) are further pulled down. However, when the voltages of Q(n) and G(n) are further pulled down, the voltage of Q(n) is fluctuated since a coupling capacitance exists in T21\T22. That is, the voltages of Q(n) and G(n) are greater than a voltage of VSS, and thus the reliable of G(n) is affected.

Accordingly, when the voltages of Q(n) and G(n) are greater than the voltage of VSS, the voltages of Q(n) and G(n) are pulled back to the voltage of VSS by the second pull-down module 200. That is, the voltages of Q(n) and G(n) can remain stable.

Specifically, the signals which are inputted to the first low frequency clock signal input terminal comprise a first low frequency clock signal LC3 and a second low frequency clock signal LC4. The display area comprises a first display area and a second display area.

When scan lines in the first display area are driven, the first low frequency clock signal is at the high level. When scan lines in the second display area are driven, the second low frequency clock signal is at the high level. The first display and the second display area, for example, are an upper half part of a screen and a lower half part of the screen.

Figure 3:
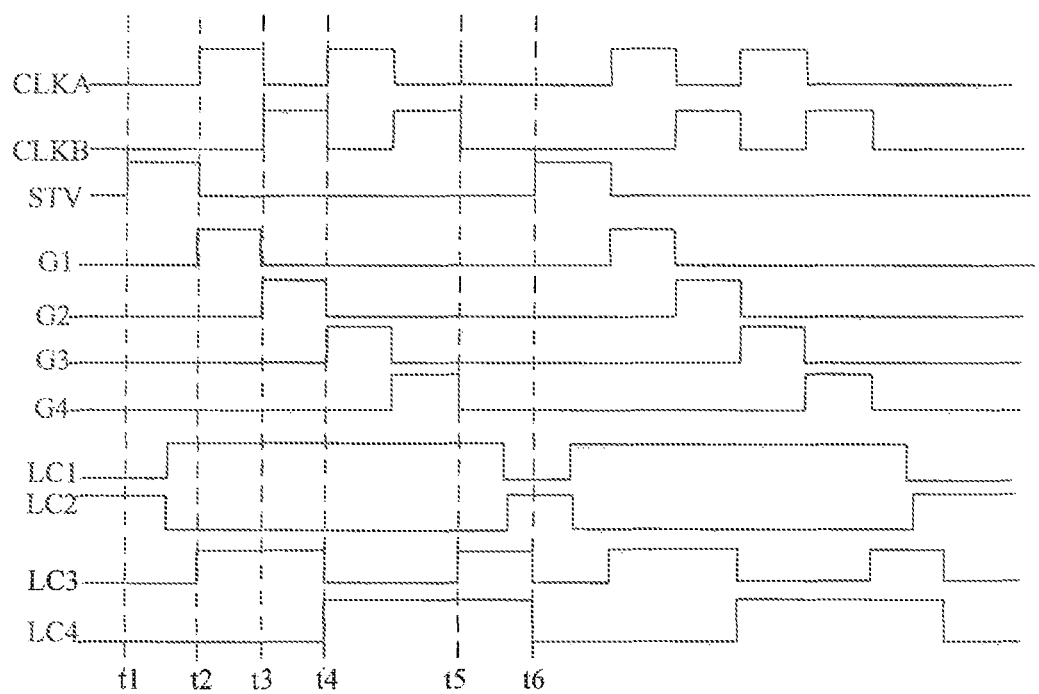
FIG. 3 is a drive waveform diagram of the gate drive circuit in accordance with the present invention.

As shown in FIG. 3, a drive waveform diagram including two frames is given. Assuming that a liquid crystal display panel comprises four rows of scan lines. STV represents a starting signal. G1-G4 represent scan signals which are inputted by the scan lines from the first to the fourth rows. In periods t1-t6 in frame 1, when scanning the upper half part (the first and the second rows) of the screen is completed, LC3 is at the high level during the drive time (t2-t4) of the upper half part of the screen, so that the scan signals in the upper half part of the screen and the voltage of the pull-down point remain at the low level. The lower half part (the third and the fourth rows) of the screen is scanned during the drive time t4-t5. To make scan signals in the lower half part of the screen and the voltage of the pull-down point remain at the high voltage, the input signal LC3 of the first low frequency clock signal input terminal outputs the high level signal only during the drive time of the upper half part. After scanning the scan lines in the lower half part of the screen is completed, the scan lines in the upper half part of the screen in a next frame are scanned. The input signal LC4 of the second low frequency clock signal input terminal outputs the high level signal only during the drive time (t4-t5) of the lower half part of the screen, so that the scan signals in the lower half part of the screen and the voltage of the pull-down point can remain at the low level. The periods t5-t6 represent a screen-off period in a frame. In order to better remain the scan lines and the voltage of the pull-down point, LC3 and LC4 are at the high level. It can be appreciated that a drive scheme in a next frame is similar to the frame 1.

The gate drive circuit of the present invention pulls down the voltages by adding the pull-down module when the voltages of the pull-down point and the output terminals are fluctuated. Accordingly, the effect of the coupling capacitance on the gate drive circuit can be eliminated, and the reliability and the lifespan of the gate circuit are improved.

The present invention further provides a liquid crystal display device which comprises gate drive units and a display area connected to the gate drive circuit. The gate drive circuit comprises multiple stages of gate drive units connected in series. An N-th stage gate drive unit comprises:

A first (N−1)th stage signal input terminal, a second (N−1)th stage signal input terminal, an (N+1)th stage signal input terminal, a high frequency clock signal input terminal, a first output terminal, a second output terminal, a pull-down point, a first low frequency clock signal input terminal, and a low level input terminal. N is an integer greater than 3.

The first (N−1)th stage signal input terminal is connected to a first output terminal of an (N−1)th stage gate drive unit. The second (N−1)th stage signal input terminal is connected to a second output terminal of the (N−1)th stage gate drive unit. The first output terminal is connected to a first (N−1)th stage signal input terminal of an (N+1)th stage gate drive unit. The second output terminal is connected to a second (N−1)th stage signal input terminal of the (N+1)th stage gate drive unit. The first output terminal is utilized for providing a scan signal for an N-th stage scan line in the display area.

The N-th stage gate drive unit further comprises:

A pull-up control module connected to the first (N−1)th stage signal input terminal, the second (N−1)th stage signal input terminal, and the pull-down point and utilized for pulling up a voltage of the pull-down point;

A pull-up module connected to the high frequency clock signal input the first output terminal, and the second output terminal, connected to the pull-down point together with the pull-up control module, and utilized for charging signals of the first output terminal and the second output terminal to pull up the voltage of the pull-down point;

A first pull-down module connected to the (N+1)th stage signal input terminal, connected to the first output terminal together with the pull-up module, connected to the pull-down point together with the pull-up control module, and utilized for pulling down the voltages of the pull-down point and the first output terminal when the signal of the first output terminal is in an uncharged state;

A pull-down control module connected to the pull-up control module and the pull-up module and utilized for pulling down the voltages of the pull-down point and the first output terminal when the voltage of the pull-down point is at a low voltage; and A second pull-down module comprising a first thin film transistor and a second thin film transistor, connected to the first low frequency clock signal input terminal and the pull-down control module, connected to the pull-down point together with the pull-up control module and the pull-up module, and utilized for controlling the voltages of the pull-down point and the first output terminal to be equal to a predetermined voltage after the voltages of the pull-down point and the first output terminal are pulled down.

The liquid crystal display device can comprise the above-mentioned gate drive circuit. The gate drive circuit is described in detail above and thus not repeated herein.

The liquid crystal display device of the present invention pulls down the voltages by adding the pull-down module when the voltages of the pull-down point and the output terminals are fluctuated. Accordingly, the effect of the coupling capacitance on the gate drive circuit can be eliminated, and the reliability and the lifespan of the gate drive circuit are improved.

As is understood by a person skilled in the art, the foregoing preferred embodiments of the present invention are illustrative rather than limiting of the present invention. It is intended that they cover various modifications and similar arrangements be included within the spirit and scope of the present invention, the scope of which should be accorded the broadest interpretation so as to encompass all such modifications and similar structures.

What is claimed is:

1. A gate drive circuit, comprising multiple stages of gate drive units connected in series, wherein an N-th stage gate drive unit comprises:
   a first (N−1)th stage signal input terminal, a second (N−1)th stage signal input terminal, an (N+1)th stage signal input terminal, a high frequency clock signal input terminal, a first output terminal, a second output terminal, a pull-down point, a first low frequency clock signal input terminal, and a low level input terminal, wherein N is an integer greater than 3;
   wherein the first (N−1)th stage signal input terminal is connected to a first output terminal of an (N−1)th stage gate drive unit; the second (N−1)th stage signal input terminal is connected to a second output terminal of the (N−1)th stage gate drive unit; the first output terminal is connected to a first (N−1)th stage signal input terminal of an (N+1)th stage gate drive unit; the second output terminal is connected to a second (N−1)th stage signal input terminal of the (N+1)th stage gate drive unit; the first output terminal is utilized for providing a scan signal for an N-th stage scan line in a display area;
   the N-th stage gate drive unit further comprises:
   a pull-up control module connected to the first (N−1)th stage signal input terminal, the second (N−1)th stage signal input terminal, and the pull-down point and utilized for pulling up a voltage of the pull-down point; the pull-down control module comprising a third thin film transistor; the third thin film transistor having a third gate, a third source, and a third drain; the third source connected to the first (N−1)th stage signal input terminal; the third gate connected to the second (N−1)th stage signal input terminal; the third drain is connected to the pull-down point;
   a pull-up module connected to the high frequency clock signal input terminal, the first output terminal, and the second output terminal, connected to the pull-down point together with the pull-up control module, and utilized for charging signals of the first output terminal and the second output terminal to pull up the voltage of the pull-down point;
   a first pull-down module connected to the (N+1)th stage signal input terminal, connected to the first output terminal together with the pull-up module, connected to the pull-down point together with the pull-up control module, and utilized for pulling down the voltages of the pull-down point and the first output terminal when a signal of the first output terminal is in an uncharged state;
   a pull-down control module connected to the pull-up control module and the pull-up module and utilized for pulling down the voltages of the pull-down point and the first output terminal when the voltage of the pull-down point is at a low voltage; and
   a second pull-down module comprising a first thin film transistor and a second thin film transistor, the second pull-down module connected to the first low frequency clock signal input terminal and the pull-down control module, connected to the pull-down point together with the pull-up control module and the pull-up module, and utilized for controlling the voltages of the pull-down point and the first output terminal to be equal to a predetermined voltage after the pull-down point and the first output terminal are pulled down;
   the first thin film transistor having a first gate, a first source, and a first drain; the second thin film transistor having a second gate, a second source, and a second drain; the first gate and the second gate connected to the first low frequency clock signal input terminal; the first source connected to the pull-down point; the first drain connected to the low level input terminal; the second source connected to the first output terminal; the second drain connected to the low level input terminal.

2. The gate drive circuit of claim 1, wherein the pull-up module comprises a fourth thin film transistor and a fifth thin film transistor; the fourth thin film transistor has a fourth gate, a fourth source, and a fourth drain; the fifth thin film transistor has a fifth gate, a fifth source, and a fifth drain;
   the fourth gate and the fifth gate are together connected to the pull-down point; the fourth source and the fifth source are together connected to the high frequency clock signal input terminal; the fourth drain is connected to the second output terminal; the fifth drain is connected to the first output terminal.

3. The gate drive circuit of claim 2, wherein the pull-up module further comprises a capacitance, a terminal of the capacitance is connected to the pull-down point, and the other terminal of the capacitance is connected to the first output terminal.

4. The gate drive circuit of claim 2, wherein the first pull-down module comprises a sixth thin film transistor and a seventh thin film transistor; the sixth thin film transistor has a sixth gate, a sixth source, and a sixth drain; the seventh thin film transistor has a seventh gate, a seventh source, and a seventh drain;
   the sixth gate and the seventh gate are connected to the (N+1)th stage signal input terminal; the sixth source is connected to the pull-down point; the sixth drain is connected to the low level input terminal; the seventh source is connected to the first output terminal; the seventh drain is connected to the low level input terminal.

5. The gate drive circuit of claim 4, wherein the N-th stage gate drive unit further comprises a second low frequency clock signal input terminal and a third low frequency clock signal input terminal;
   the pull-down control module comprises a first pull-down control submodule;
   the first pull-down control submodule comprises an eighth thin film transistor, a ninth thin film transistor, a tenth thin film transistor, an eleventh thin film transistor, a twelfth thin film transistor, and a thirteenth thin film transistor;
   the eighth thin film transistor has an eighth gate, an eighth source, and an eighth drain; the ninth thin film transistor has a ninth gate, a ninth source, and a ninth drain; the tenth thin film transistor has a tenth gate, a tenth source, and a tenth drain; the eleventh thin film transistor has an eleventh gate, an eleventh source, and an eleventh drain; the twelfth thin film transistor has a twelfth gate, a twelfth source, and a twelfth drain; the thirteenth thin film transistor has a thirteenth gate, a thirteenth source, and a thirteenth drain;

the eighth gate is connected to the pull-down point; the eighth source is connected to the ninth drain; the eighth drain is connected to the low level input terminal;

the ninth gate is connected to the second low frequency clock signal input terminal; the ninth source is connected to the ninth gate; the ninth drain is connected to the tenth gate;

the tenth source is connected to the ninth source; the tenth drain is connected to the twelfth gate and the thirteen gate;

the eleventh gate is connected to the eighth gate; the eleventh source is connected to the tenth drain; the eleventh drain is connected to the low level input terminal;

the twelfth source is connected to the pull-down point; the thirteenth source is connected to the first output terminal; the twelfth drain and the thirteenth drain are connected to the low level input terminal.

6. The gate drive circuit of claim 5, wherein the pull-down control module comprises a second pull-down control submodule;

the second pull-down control submodule comprises a fourteenth thin film transistor, a fifteenth thin film transistor, a sixteenth thin film transistor, a seventeenth thin film transistor, an eighteenth thin film transistor, and a nineteenth thin film transistor;

the fourteenth thin film transistor has a fourteenth gate, a fourteenth source, and a fourteenth drain; the fifteenth thin film transistor has a fifteenth gate, a fifteenth source, and a fifteenth drain; the sixteenth thin film transistor has a sixteenth gate, a sixteenth source, and a sixteenth drain; the seventeenth thin film transistor has a seventeenth gate, a seventeenth source, and a seventeenth drain; the eighteenth thin film transistor has an eighteenth gate, an eighteenth source, and an eighteenth drain; the nineteenth thin film transistor has a nineteenth gate, a nineteenth source, and a nineteenth drain;

the fourteenth gate is connected to the pull-down point; the fourteenth source is connected to the fifteenth drain; the fourteenth drain is connected to the low level input terminal;

the fifteenth gate is connected to the third low frequency clock signal input terminal; the fifteenth source is connected to the fifteenth gate; the fifteenth drain is connected to the sixteenth gate;

the sixteenth source is connected to the fifteenth source; the sixteenth drain is connected to the eighteenth gate and the nineteenth gate;

the seventeenth gate is connected to the fourteenth gate; the seventeenth source is connected to the sixteenth drain; the seventeenth drain is connected to the low level input terminal;

the eighteenth source is connected to the pull-down point; the nineteenth source is connected to the first output terminal; the eighteenth drain and the nineteenth drain are connected to the low level input terminal.

7. The gate drive circuit of claim 1, wherein signals which are inputted to the first low frequency clock signal input terminal comprise a first low frequency clock signal and a second low frequency clock signal; the display area comprises a first display area and a second display area;

when scan lines in the first display area are driven, the first low frequency clock signal is at a high level; when scan lines in the second display area are driven, the second low frequency clock signal is at the high level.

8. A gate drive circuit, comprising multiple stages of gate drive units connected in series, wherein an N-th stage gate drive unit comprises:

a first (N−1)th stage signal input terminal, a second (N−1)th stage signal input terminal, an (N+1)th stage signal input terminal, a high frequency clock signal input terminal, a first output terminal, a second output terminal, a pull-down point, a first low frequency clock signal input terminal, and a low level input terminal, wherein N is an integer greater than 3;

wherein the first (N−1)th stage signal input terminal is connected to a first output terminal of an (N−1)th stage gate drive unit; the second (N−1)th stage signal input terminal is connected to a second output terminal of the (N−1)th stage gate drive unit; the first output terminal is connected to a first (N−1)th stage signal input terminal of an (N+1)th stage gate drive unit; the second output terminal is connected to a second (N−1)th stage signal input terminal of the (N+1)th stage gate drive unit; the first output terminal is utilized for providing a scan signal for an N-th stage scan line in a display area;

the N-th stage gate drive unit further comprises:

a pull-up control module connected to the first (N−1)th stage signal input terminal, the second (N−1)th stage signal input terminal, and the pull-down point and utilized for pulling up a voltage of the pull-down point;

a pull-up module connected to the high frequency clock signal input terminal, the first output terminal, and the second output terminal, connected to the pull-down point together with the pull-up control module, and utilized for charging signals of the first output terminal and the second output terminal to pull up the voltage of the pull-down point;

a first pull-down module connected to the (N+1)th stage signal input terminal, connected to the first output terminal together with the pull-up module, connected to the pull-down point together with the pull-up control module, and utilized for pulling down the voltages of the pull-down point and the first output terminal when the signal of the first output terminal is in an uncharged state;

a pull-down control module connected to the pull-up control module and the pull-up module and utilized for pulling down the voltages of the pull-down point and the first output terminal when the voltage of the pull-down point is at a low voltage; and a second pull-down module comprising a first thin film transistor and a second thin film transistor, the second pull-down module connected to the first low frequency clock signal input terminal and the pull-down control module, connected to the pull-down point together with the pull-up control module and the pull-up module, and utilized for controlling the voltages of the pull-down point and the first output terminal to be equal to a predetermined voltage after the pull-down point and the first output terminal are pulled down.

9. The gate drive circuit of claim 8, wherein the first thin film transistor has a first gate, a first source, and a first drain; the second thin film transistor has a second gate, a second source, and a second drain; the first gate and the second gate are connected to the first low frequency clock signal input terminal; the first source is connected to the pull-down point; the first drain is connected to the low level input terminal;

the second source is connected to the first output terminal; the second drain is connected to the low level input terminal.

10. The gate drive circuit of claim 8, wherein the pull-down control module comprises a third thin film transistor; the third thin film transistor has a third gate, a third source, and a third drain;
the third source is connected to the first (N−1)th stage signal input terminal; the third gate is connected to the second (N−1)th stage signal input terminal; the third drain is connected to the pull-down point.

11. The gate drive circuit of claim 10, wherein the pull-up module comprises a fourth thin film transistor and a fifth thin film transistor; the fourth thin film transistor has a fourth gate, a fourth source, and a fourth drain; the fifth thin film transistor has a fifth gate, a fifth source, and a fifth drain;
the fourth gate and the fifth gate are together connected to the pull-down point;
the fourth source and the fifth source are together connected to the high frequency clock signal input terminal; the fourth drain is connected to the second output terminal; the fifth drain is connected to the first output terminal.

12. The gate drive circuit of claim 11, wherein the pull-up module further comprises a capacitance, a terminal of the capacitance is connected to the pull-down point, and the other terminal of the capacitance is connected to the first output terminal.

13. The gate drive circuit of claim 11, wherein the first pull-down module comprises a sixth thin film transistor and a seventh thin film transistor; the sixth thin film transistor has a sixth gate, a sixth source, and a sixth drain; the seventh thin film transistor has a seventh gate, a seventh source, and a seventh drain;
the sixth gate and the seventh gate are connected to the (N+1)th stage signal input terminal; the sixth source is connected to the pull-down point; the sixth drain is connected to the low level input terminal; the seventh source is connected to the first output terminal; the seventh drain is connected to the low level input terminal.

14. The gate drive circuit of claim 13, wherein the N-th stage gate drive unit further comprises a second low frequency clock signal input terminal and a third low frequency clock signal input terminal;
the pull-down control module comprises a first pull-down control submodule;
the first pull-down control submodule comprises an eighth thin film transistor, a ninth thin film transistor, a tenth thin film transistor, an eleventh thin film transistor, a twelfth thin film transistor, and a thirteenth thin film transistor;
the eighth thin film transistor has an eighth gate, an eighth source, and an eighth drain; the ninth thin film transistor has a ninth gate, a ninth source, and a ninth drain; the tenth thin film transistor has a tenth gate, a tenth source, and a tenth drain; the eleventh thin film transistor has an eleventh gate, an eleventh source, and an eleventh drain; the twelfth thin film transistor has a twelfth gate, a twelfth source, and a twelfth drain; the thirteenth thin film transistor has a thirteenth gate, a thirteenth source, and a thirteenth drain;
the eighth gate is connected to the pull-down point; the eighth source is connected to the ninth drain; the eighth drain is connected to the low level input terminal;
the ninth gate is connected to the second low frequency clock signal input terminal; the ninth source is connected to the ninth gate; the ninth drain is connected to the tenth gate;
the tenth source is connected to the ninth source; the tenth drain is connected to the twelfth gate and the thirteen gate;
the eleventh gate is connected to the eighth gate; the eleventh source is connected to the tenth drain; the eleventh drain is connected to the low level input terminal;
the twelfth source is connected to the pull-down point; the thirteenth source is connected to the first output terminal; the twelfth drain and the thirteenth drain are connected to the low level input terminal.

15. The gate drive circuit of claim 14, wherein the pull-down control module comprises a second pull-down control submodule;
the second pull-down control submodule comprises a fourteenth thin film transistor, a fifteenth thin film transistor, a sixteenth thin film transistor, a seventeenth thin film transistor, an eighteenth thin film transistor, and a nineteenth thin film transistor;
the fourteenth thin film transistor has a fourteenth gate, a fourteenth source, and a fourteenth drain; the fifteenth thin film transistor has a fifteenth gate, a fifteenth source, and a fifteenth drain; the sixteenth thin film transistor has a sixteenth gate, a sixteenth source, and a sixteenth drain; the seventeenth thin film transistor has a seventeenth gate, a seventeenth source, and a seventeenth drain; the eighteenth thin film transistor has an eighteenth gate, an eighteenth source, and an eighteenth drain; the nineteenth thin film transistor has a nineteenth gate, a nineteenth source, and a nineteenth drain;
the fourteenth gate is connected to the pull-down point; the fourteenth source is connected to the fifteenth drain; the fourteenth drain is connected to the low level input terminal;
the fifteenth gate is connected to the third low frequency clock signal input terminal; the fifteenth source is connected to the fifteenth gate; the fifteenth drain is connected to the sixteenth gate;
the sixteenth source is connected to the fifteenth source; the sixteenth drain is connected to the eighteenth gate and the nineteenth gate;
the seventeenth gate is connected to the fourteenth gate; the seventeenth source is connected to the sixteenth drain; the seventeenth drain is connected to the low level input terminal;
the eighteenth gate is connected to the pull-down point; the nineteenth source is connected to the first output terminal; the eighteenth drain and the nineteenth drain are connected to the low level input terminal.

16. The gate drive circuit of claim 8, wherein signals which are inputted to the first low frequency clock signal input terminal comprise a first low frequency clock signal and a second low frequency clock signal; the display area comprises a first display area and a second display area;
when scan lines in the first display area are driven, the first low frequency clock signal is at a high level; when scan lines in the second display area are driven, the second low frequency clock signal is at the high level.

17. A liquid crystal display device, comprising a gate drive circuit and a display area connected to the gate drive circuit;

the gate drive circuit comprising multiple stages of gate drive units connected in series, wherein an N-th stage gate drive unit comprises:

a first (N−1)th stage signal input terminal, a second (N−1)th stage signal input terminal, an (N+1)th stage signal input terminal, a high frequency clock signal input terminal, a first output terminal, a second output terminal, a pull-down point, a first low frequency clock signal input terminal, and a low level input terminal, wherein N is an integer greater than 3;

wherein the first (N−1)th stage signal input terminal is connected to a first output terminal of an (N−1)th stage gate drive unit; the second (N−1)th stage signal input terminal is connected to a second output terminal of the (N−1)th stage gate drive unit; the first output terminal is connected to a first (N−1)th stage signal input terminal of an (N+1)th stage gate drive unit; the second output terminal is connected to a second (N−1)th stage signal input terminal of the (N+1)th stage gate drive unit; the first output terminal is utilized for providing a scan signal for an N-th stage scan line in a display area;

the N-th stage gate drive unit further comprises:

a pull-up control module connected to the first (N−1)th stage signal input terminal, the second (N−1)th stage signal input terminal, and the pull-down point and utilized for pulling up a voltage of the pull-down point;

a pull-up module connected to the high frequency clock signal input terminal, the first output terminal, and the second output terminal, connected to the pull-down point together with the pull-up control module, and utilized for charging signals of the first output terminal and the second output terminal to pull up the voltage of the signal of the pull-down point;

a first pull-down module connected to the (N+1)th stage signal input terminal, connected to the first output terminal together with the pull-up module, connected to the pull-down point together with the pull-up control module, and utilized for pulling down the voltages of the pull-down point and the first output terminal when the signal of the first output terminal is in an uncharged state;

a pull-down control module connected to the pull-up control module and the pull-up module and utilized for pulling down the voltages of the pull-down point and the first output terminal when the voltage of the pull-down point is at a low voltage; and a second pull-down module comprising a first thin film transistor and a second thin film transistor, the second pull-down module connected to the first low frequency clock signal input terminal and the pull-down control module, connected to the pull-down point together with the pull-up control module and the pull-up module, and utilized for controlling the voltages of the pull-down point and the first output terminal to be equal to a predetermined voltage after the pull-down point and the first output terminal are pulled down.

18. The liquid crystal display device of claim 17, wherein the first thin film transistor has a first gate, a first source, and a first drain; the second thin film transistor has a second gate, a second source, and a second drain; the first gate and the second gate are connected to the first low frequency clock signal input terminal; the first source is connected to the pull-down point; the first drain is connected to the low level input terminal; the second source is connected to the first output terminal; the second drain is connected to the low level input terminal.

19. The liquid crystal display device of claim 17, wherein the pull-down control module comprises a third thin film transistor; the third thin film transistor has a third gate, a third source, and a third drain;

the third source is connected to the first (N−1)th stage signal input terminal; the third gate is connected to the second (N−1)th stage signal input terminal; the third drain is connected to the pull-down point.

20. The liquid crystal display device of claim 19, wherein the pull-up module comprises a fourth thin film transistor and a fifth thin film transistor; the fourth thin film transistor has a fourth gate, a fourth source, and a fourth drain; the fifth thin film transistor has a fifth gate, a fifth source, and a fifth drain;

the fourth gate and the fifth gate are together connected to the pull-down point; the fourth source and the fifth source are together connected to the high frequency clock signal input terminal; the fourth drain is connected to the second output terminal; the fifth drain is connected to the first output terminal.

* * * * *